(12) United States Patent
Tseng

(10) Patent No.: US 6,218,242 B1
(45) Date of Patent: Apr. 17, 2001

(54) METHOD FOR FABRICATING CAPACITORS IN SEMICONDUCTOR INTEGRATED CIRCUIT

(75) Inventor: Horng-Huei Tseng, Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 0 days.

(21) Appl. No.: 09/660,622

(22) Filed: Sep. 13, 2000

(51) Int. Cl.⁷ .............................................. H01L 21/8242
(52) U.S. Cl. ............................................ 438/253; 438/255
(58) Field of Search ........................ 438/238, 253–256, 438/381, 393–399

(56) References Cited

U.S. PATENT DOCUMENTS

Re. 36,786    7/2000  Fazan et al. ........................... 438/253
5,854,107  * 12/1998  Park et al. ............................. 438/254
6,008,085  * 12/1999  Sung et al. ............................ 438/253

* cited by examiner

*Primary Examiner*—Jey Tsai
(74) *Attorney, Agent, or Firm*—Jiawei Huang; J C Patents

(57) ABSTRACT

A capacitor is formed by providing a substrate, which has conductive structures with cap layer formed thereon. A first dielectric layer is formed over the substrate and the conductive structures. The first dielectric layer is patterned to form an opening to expose the substrate between the conductive structures and the sidewalls of the conductive structures. A conductive plug fills the opening. A second dielectric layer is formed over the first dielectric layer and the conductive plug. The second dielectric layer is patterned to form a narrow opening to expose the conductive plug. A conductive bar is formed to fill the narrow opening. The second dielectric layer is removed. A dielectric spacer is formed on the sidewall of the conductive bar. A conductive spacer is formed on the dielectric spacer. The conductive spacer has electric contact with the conductive plug. The dielectric spacer is removed by isotropic etching. Then, a conformal capacitor dielectric layer and an electrode conductive layer are sequentially formed over the substrate.

18 Claims, 2 Drawing Sheets

METHOD FOR FABRICATING CAPACITORS IN SEMICONDUCTOR INTEGRATED CIRCUIT

BACKGROUND OF THE INVENTION

1. Field of Invention

The present invention relates to semiconductor fabrication. More particularly, the present invention relates to a method for fabricating a capacitor in a semiconductor integrated circuit.

2. Description of Related Art

A semiconductor integrated circuit usually needs a capacitor. Particularly, a memory device needs the capacitors for each memory cell to store the binary data, according to the bias level of the capacitors. For a memory device such as dynamic random access memory (DRAM), generally, an array of capacitors on the substrate are storing the binary data by charging or discharging the capacitors. One capacitor acts one bit of memory for storing the binary data "0" or "1" corresponding to the status of capacitor being "charged" or "discharged", respectively. The action of read/write in the DRAM is done through a transfer field effect transistor (TFET), in which a source of the TFET is coupled to a bit line (BL), a drain is coupled to the capacitor and a gate is coupled to a word line (WL). The BL carries a voltage level to charge the capacitor through the TFET, where the TFET is selectively controlled by the WL to be activated or inactivated. Thus a writing action can be done. On the other hand, if one wants to read the binary data having been stored, the BL is switched to a comparator circuit, or a sense amplifier, to check the voltage status of the capacitor for the reading action. Therefore the charges stored in the capacitor is essential to a memory quality in the DRAM The charges stored in the capacitor depends on the capacitance of the capacitor. The capacitance is determined by the storing area of the storage electrode, the isolating reliability between an upper electrode and a lower electrode of the capacitor, and dielectric constant of dielectric, which has been chosen. To be able to store more data, the density of the capacitors used in the memory device tends to increase. This results in the storage charges would be decreased. If the storage charges can stay high, the affections of noise to the sense amplifier for reading can be effectively reduced and it is not necessary to refresh the voltage level of the capacitor, frequently.

While the integration is increasing, the size of memory cell in a DRAM is reduced, accordingly. As known by one skilled in the art, the reduced size of the capacitor gives a result of lower capacitance. If the capacitance is decreased, the soft error due to the α particles can happen with higher probability. Therefore, it is desired that a capacitor has a reduced size but can keep sufficient capacitance. In order to achieve this purpose, various capacitor structure designs have been proposed, such as a stacked capacitor. However, an efficient method to fabricate a desired capacitor structure is still under developing. A method to fabricate a stack capacitor has been disclosed in U.S. Pat. No. RE36786. However, the method is still not efficient to have the desired capacitance.

SUMMARY OF THE INVENTION

The invention provides a method for fabricating capacitor in a semiconductor device, so as to effectively increase the capacitance of the capacitor. The method includes providing a substrate, which has several conductive structures formed thereon. The conductive structure has a cap layer on top. A doped region is formed in the substrate between the conductive structures. A first dielectric layer is formed over the substrate and the conductive structures. The first dielectric layer is patterned to form an opening between the conductive structures, where the opening exposes the doped region of the substrate, the sidewalls of the conductive structures, and a portion of top surface of the conductive structures. A conductive plug fills the opening. A second dielectric layer is formed over the first dielectric layer and the conductive plug. The second dielectric layer is patterned to form a narrow opening to expose the conductive plug. A conductive bar is formed to fill the narrow opening. The second dielectric layer is removed to expose a sidewall of the conductive bar and a portion of the conductive plug. A dielectric spacer is formed on the sidewall of the conductive bar. A portion of the conductive plug is still exposed. A conductive spacer is formed on the exposed sidewall of the dielectric spacer. The conductive spacer has electric contact with the conductive plug. The dielectric spacer is removed by isotropic etching. Here, the dielectric spacer and the first dielectric layer have different materials so that the desired etching selectivity is set. As a result, the conductive bar and the conductive spacer form the electrode structure to produce more charge storage area. Then, a conformal capacitor dielectric layer is formed over the substrate to at least cover the conductive bar, the conductive spacer, and the exposed portion of the conductive plug. An electrode conductive layer is formed on the capacitor dielectric layer.

In the forgoing, before the capacitor dielectric layer is formed, a typical hemspherical grain (HSG) conductive layer can also be formed on the exposed surface of the conductive bar and the conductive spacer to further increase the charge storage area. The HSG conductive layer preferably is HSG silicon layer. The HSG silicon layer can be formed by forming a blanket HSG layer over the topographic surface of the substrate. An insulating spacer is formed on sidewalls of the conductive spacer and the conductive bar. An etching back process is performed on the HSG silicon layer, using the insulating spacer as the mask. The insulating spacer is then removed. As a result, the remaining portion of the HSG silicon layer is formed on the exposed peripheral surface of the conductive spacer, the conductive bar, and the conductive plug.

In the foregoing, the conductive structure includes, for example, a gate electrode, a world line, or a conductive line. The first dielectric layer includes, for example, a two-layer structure with a lower dielectric layer surrounding the conductive structures, and an upper dielectric layer formed over the first dielectric layer and the conductive structure.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In order to increase the capacitance of the capacitor in a limited space for the memory device, such as the DRAM device, the capacitor is necessary to be designed to have sufficient charge storage area. The capacitor structure also associates a fabrication process. FIGS. 1A–1E are cross-sectional view, schematically illustrating the process for fabricating a capacitor for a DRAM device, according to one preferred embodiment of this invention.

Figure 1A:
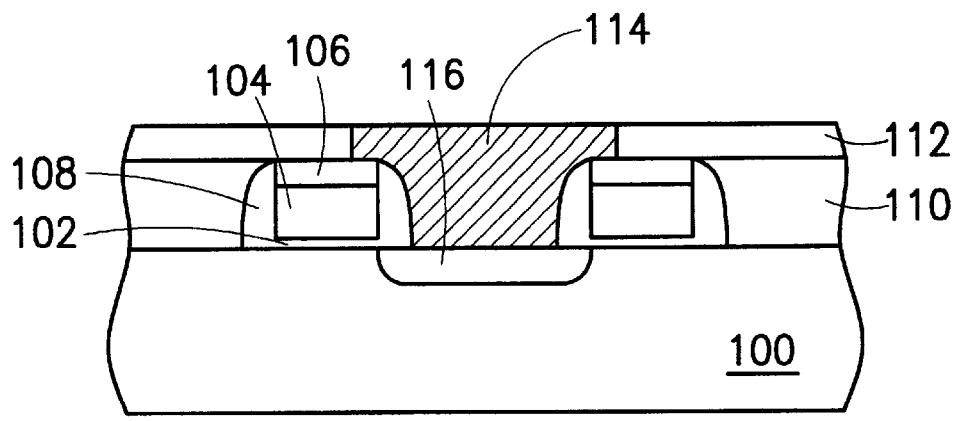
FIGS. 1A–1E are cross-sectional view, schematically illustrating a process for fabricating a capacitor on a memory device, according to one preferred embodiment of this invention.

In FIG. 1A, a substrate 100 is provided. Several conductive structures are formed on the substrate 100. The conductive structures include, for example, gate electrodes and word lines connecting the gate electrodes, or conductive lines. Here, only the cross-sectional view crossing the gate electrode is shown. The gate electrode typically includes a gate oxide layer 102 on the substrate 100, a polysilicon gate layer 104 on the gate oxide layer 102, and a cap layer 106 on the polysilicon gate layer 104. Moreover, a spacer 108 is also formed on a sidewall of the gate electrode. A doped region 116 serving, for example, as a source/drain region is also formed in the substrate 100 between the gate electrodes.

Then, a dielectric layer is formed over the substrate 100 and also covers the gate electrodes. The dielectric layer can, for example, has a two-layer structure, including a lower dielectric layer 110 and an upper dielectric layer 112. The lower dielectric layer 110 surrounds the gate electrode, and the upper dielectric layer 112 is formed on the lower dielectric layer 110. The dielectric layer 110 includes, for example, silicon oxide with a thickness of, for example, 3000–8000 angstroms. The dielectric layer 112 includes, for example, silicon nitride with a thickness of, for example, 500–2000 angstroms. The dielectric layers 110, 112 are patterned to form an opening, which exposes the doped region 116 in the substrate 100 between the gate electrodes. The side surface of the gate electrode and a portion of the cap layer 106 are also exposed by the opening, where the side surface is the outer surface of the spacer 108 in the example. The opening is then filled with a conductive plug 114.

The conductive plug 114 can be formed by, for example, depositing a preliminary conductive layer, such as polysilicon, copper, aluminum, tungsten, or copper, over the substrate 100, and performing a chemical mechanical polishing (CMP) process to polish a top portion of the preliminary conductive layer by using the dielectric layer 112 as a polishing stop.

Figure 1B:
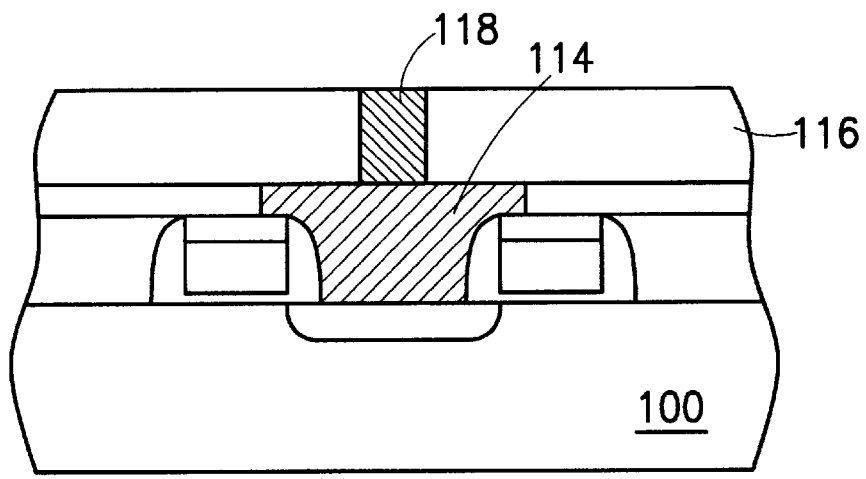

In FIG. 1B, a dielectric layer 116 is formed over the dielectric layer 112 and the conductive plug 114. The material of the dielectric layer 116 should be different from the material of the dielectric layer 112. Preferably, the dielectric layer 116 includes silicon oxide while the dielectric layer 112 includes silicon nitride, so that a sufficiently large etching selectivity can be achieved.

The dielectric layer 116 is patterned to have a narrow opening to expose the conductive plug 114. A conductive bar 118 fills into the narrow opening in the dielectric layer 116. The conductive bar 118 can be formed by depositing a conductive material layer to fill the narrow opening, and performing a CMP process to polish the conductive material layer using the dielectric layer 112 as the polishing stop. Here, the narrow opening means that the opening has a width which is sufficiently small, so that the opening is relatively easy to be completely filled when the conductive material layer is deposited. The thickness of the dielectric layer 116 is a factor to obtain a higher capacitance as is to be seen later. Preferably, the thickness of the dielectric layer 116 is about 4000–10000 angstroms.

Figure 1C:
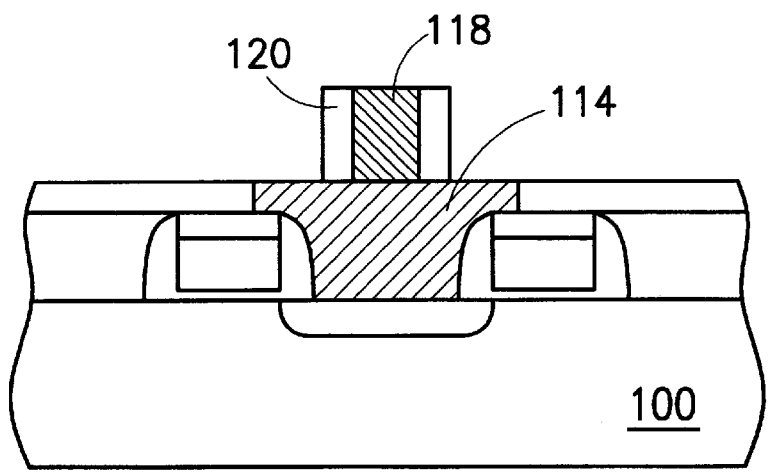

In FIG. 1C, the dielectric layer 116 is removed by, for example, wet etching with HF acid solution, where the dielectric later 112 remains. A sidewall of the conductive bar is further exposed. A dielectric spacer 120 is formed on the sidewall of the conductive bar 118. The dielectric spacer 120 also includes a material different than that of the dielectric layer 112. Typically, the dielectric spacer 120 is formed by depositing a dielectric material layer over the substrate 100 to cover the conductive bar 118, and performing an etching back process to remove the dielectric material layer. The remaining portion form the dielectric spacer 120. Due to the different materials, the etching selectivity can be easily chosen.

Figure 1D:
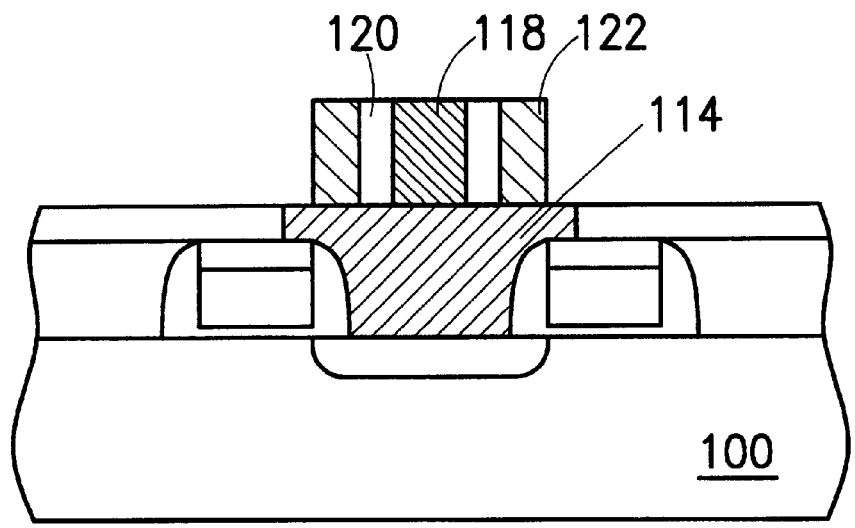

In FIG. 1D, in order to increase the charge storage area, a conductive spacer 122 is formed on the dielectric spacer 120 with electrical contact to the conductive plug 114. The conductive spacer 122 can be formed by, for example, deposing a conductive material layer over the substrate 100 to cover the dielectric spacer 120 and the conductive bar 118, and etching back the conductive material layer. The remaining portion of the conductive material layer is the conductive spacer 122. The conductive bar 118 and the conductive spacer 122 preferably include polysilicon, which may be also doped.

Figure 1E:
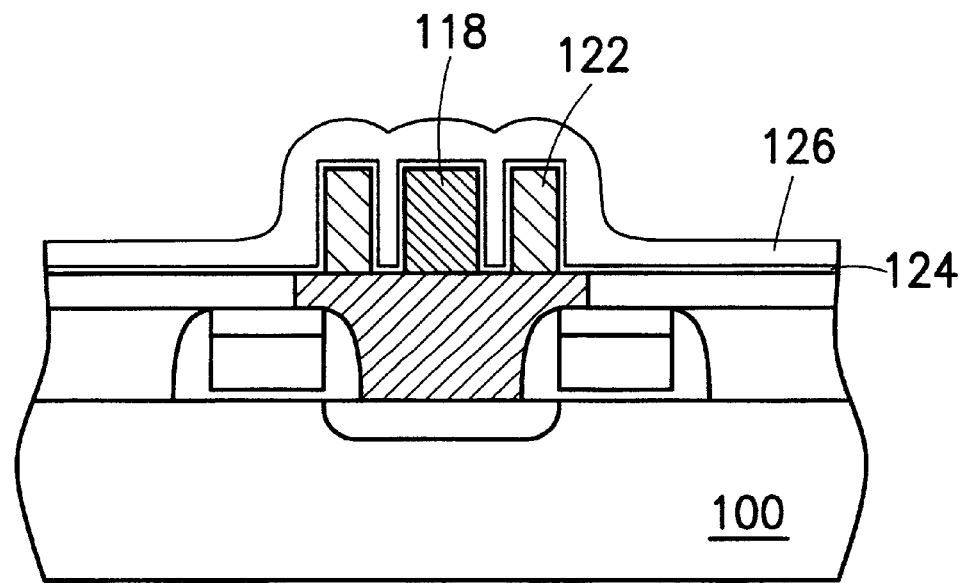

In FIG. 1E, a conformal capacitor dielectric layer 124 is formed a topographic surface of the substrate 100. The capacitor dielectric layer 124 includes, for example, oxide/nitride (O/N), or oxide/nitride/oxide (O/N/O). Then a conductive layer 126, serving as another electrode of the capacitor is formed on the capacitor dielectric layer 124. The conductive bar 118 and the conductive spacer 122 provide more charge storage area for the capacitor.

In order to further increase the capacitance, a hemispherical grain (HSG) conductive layer can be formed on the peripheral exposed surface of the conductive bar 118 and the conductive spacer 122. The method includes forming a conformal HSG conductive layer over the substrate 100; forming a sacrificial dielectric spacer over sidewalls of the conductive bar 118 and the conductive spacer 122; performing an etching back process to remove a portion of the HSG conductive layer, using the sacrificial dielectric spacer as a mask; and removing the sacrificial dielectric spacer. The remaining portion of the HSG layer is on the peripheral exposed surface of the conductive bar 118 and the conductive spacer 122. Due to the HSG structure, the charge storage area is increased.

In the foregoing the capacitor is formed on the doped region 116 of the gate electrode. However, the gate electrode can be a general conductive structure, such as a conductive line or word line in the memory device.

In summary, the present invention has several features. The conductive bar 118 can be formed with narrow width. The conductive spacer 122 adjacent to the conductive bar 118 is also formed using the dielectric spacer 120, so that the charge storage area effectively increases. The two-layer dielectric layer can also be a single dielectric layer with proper material, so as to have desired etching selectivity. Most of the etching processes are performed under the self-aligned manner without extra photolithographic process. This also reduces the fabrication cost.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a capacitor in an integrated circuit, the method comprising:
   providing a substrate, wherein the substrate has conductive structures with a cap layer on top;
   forming a first dielectric layer over the substrate and the conductive structures;
   patterning the first dielectric layer to form a first opening between the conductive structures, wherein the opening exposes a portion of the substrate between the conductive structures and a side surface of the conductive structures;
   filling a conductive plug into the first opening;
   forming a second dielectric layer over the first dielectric layer and the conductive plug;
   patterning the second dielectric layer to form a second opening that exposes the conductive plug;
   forming a conductive bar filling into the second opening in the second dielectric layer;
   removing the second dielectric layer to expose a sidewall of the conductive bar;
   forming a dielectric spacer on the sidewall of the conductive bar;
   forming a conductive spacer on the dielectric spacer, wherein the conductive spacer has electric contact with the conductive plug;
   removing the dielectric spacer;
   forming a conformal capacitor dielectric layer over the substrate; and
   forming a conductive layer, serving as a capacitor electrode, over the substrate.

2. The method of claim 1, wherein the step of forming the first dielectric layer comprises forming a two-layer structure including forming a third dielectric layer surrounding the conductive structures, and forming a fourth dielectric layer over the third dielectric layer and the cap layer of the conductive structure.

3. The method of claim 2, wherein the third dielectric layer comprises silicon oxide and the fourth dielectric layer comprises silicon nitride.

4. The method of claim 2, wherein the third dielectric layer has a thickness of about between 3000 and 8000 angstroms.

5. The method of claim 2, wherein the fourth dielectric layer has a thickness of about between 500 and 2000 angstroms.

6. The method of claim 1, wherein in the step of patterning the first dielectric layer to form the first opening, the first opening also exposes a portion of a top surface of the conductive structures.

7. The method of claim 1, wherein the conductive structures comprises a polysilicon line.

8. The method of claim 1, wherein the conductive structures comprises a gate electrode.

9. The method of claim 1, wherein before the step of forming the dielectric layer, the method comprises forming a doped region in the substrate between the conductive structures.

10. The method of claim 1, wherein the dielectric spacer comprises silicon oxide while the first dielectric layer includes silicon nitride on top.

11. The method of claim 1, wherein in the step of forming the second dielectric, the second dielectric layer comprises silicon nitride.

12. The method of claim 1, wherein in the step of forming the second dielectric, the second dielectric is formed to have a thickness of about 4000–10000 angstroms.

13. The method of claim 1, wherein the step of forming the conductive bar filling into the second opening comprises:
   depositing a conductive material layer over the second dielectric layer, wherein the second opening has a width, which allows the conductive material layer to fully fill into the second opening; and
   performing a chemical mechanical polishing (CMP) process to polish the conductive material layer, using the second dielectric layer as a polishing stop.

14. The method of claim 1, wherein the step of forming the dielectric spacer on the sidewall of the conductive bar comprises:
   forming a dielectric material layer over the substrate; and
   performing an etching back process to remove the dielectric material layer, wherein a remaining portion of the dielectric material layer forms the dielectric spacer.

15. The method of claim 1, wherein the step of forming the conductive spacer on the dielectric spacer comprises:
   forming a conductive material layer over the substrate; and
   performing an etching back process to remove the conductive material layer, wherein a remaining portion of the conductive material layer forms the conductive spacer on the dielectric spacer.

16. The method of claim 1, wherein before forming the conformal capacitor dielectric layer over the substrate, the method further comprises forming a hemi-spherical grain (HSG) conductive layer at least on sidewalls of the conductive spacer and the conductive bar.

17. The method of claim 16, wherein the HSG conductive layer comprises a HSG silicon layer.

18. The method of claim 16, wherein the HSG conductive layer is formed by steps of:
   forming a conformal HSG conductive layer over the substrate;
   forming a sacrificial dielectric spacer over sidewalls of the conductive bar and the conductive spacer;
   performing an etching back process to remove a portion of the HSG conductive layer, using the sacrificial dielectric spacer as a mask; and
   removing the sacrificial dielectric spacer.

* * * * *